United States Patent [19]

Shimura et al.

[11] Patent Number: 5,321,458
[45] Date of Patent: Jun. 14, 1994

[54] METHOD AND APPARATUS FOR DEVELOPING PRESENSITIZED OFFSET PRINTING PLATES

[75] Inventors: Kazuhiro Shimura; Masafumi Uehara; Shinya Watanabe, all of Hino, Japan

[73] Assignee: Konica Corporation, Tokyo, Japan

[21] Appl. No.: 944,013

[22] Filed: Sep. 11, 1992

Related U.S. Application Data

[62] Division of Ser. No. 726,809, Jul. 8, 1991, abandoned.

[30] Foreign Application Priority Data

Jul. 11, 1990 [JP] Japan .................. 2-183368

[51] Int. Cl.$^5$ .............................................. G03D 3/02
[52] U.S. Cl. ............................................. 354/324
[58] Field of Search .................. 354/324, 319, 320

[56] References Cited

U.S. PATENT DOCUMENTS

| | | | |
|---|---|---|---|
| 4,374,920 | 2/1983 | Wanat et al. | 430/331 |
| 4,436,807 | 3/1984 | Walls | 430/309 |
| 4,452,880 | 6/1984 | Seino et al. | 430/309 |
| 4,469,776 | 9/1984 | Matsumoto et al. | 430/309 |
| 5,055,870 | 10/1991 | Ohba et al. | 354/317 |

FOREIGN PATENT DOCUMENTS 0080042 6/1983 European Pat. Off.

*Primary Examiner*—D. Rutledge
*Attorney, Agent, or Firm*—Finnegan, Henderson, Farabow, Garrett & Dunner

[57] ABSTRACT

The improved method of development is implemented with an automatic processor for developing presensitized offset printing plates with a substantially virgin aqueous solution that contains an alkali silicate and that is supplied for each printing plate, said aqueous solution containing calcium ions in an amount of up to 10 mg/L. The improved developing apparatus comprises a means of mixing a concentrated developing solution with diluent water to prepare a working solution and a means of applying the working solution onto the surface of a presensitized offset printing plate being transported. The apparatus is characterized by further including a mechanism that performs ion-exchange on the diluent water before it is mixed with the concentrated developing solution.

6 Claims, 1 Drawing Sheet

METHOD AND APPARATUS FOR DEVELOPING PRESENSITIZED OFFSET PRINTING PLATES

This application is a division of application Ser. No. 07/726,809 filed Jul. 8, 1991, now abandoned.

BACKGROUND OF THE INVENTION

This invention relates to a method and apparatus for developing presensitized offset printing plates. More particularly, this invention relates to a method and apparatus for developing presensitized offset printing plates of the type that are individually processed with a substantially virgin aqueous solution containing an alkali Silicate, which aqueous solution can after use be disposed of without causing the problem of sludge formation in the developing solution or subsequent scumming of the printing plates.

Presensitized offset printing plates can be developed by various methods among which is one that comprises diluting a concentrated solution of an alkali silicate and supplying the diluted solution onto the surface of printing plates. Ordinary tap water is used to dilute the concentrated solution of an alkali silicate. However, if tap water or well water is directly used as the diluent, calcium ions contained in that water will bind with the silicic acid in the developing solution to form a precipitate, which can potentially plug the pump for feeding the diluted solution or the temperature controlling heater. The precipitate is also deposited on the presensitized plate being processed, which will eventually foul the print.

Unexamined Published Japanese Patent Application No. 54341/1983 discloses a technique in which a specified amount of a water softener capable of at least 50% sequestration at the pH of a developing solution of interest is contained in that developing solution which contains an alkali agent, etc., whereby the generation of a slimy product can be prevented that would otherwise occur if the organic high polymer (having an acid value of 10–200) contained in the light-sensitive layer dissolved into the developing solution and underwent an ionic crosslinking reaction with calcium and/or magnesium ions. Unexamined Published Japanese Patent Application No. 190952/1983 discloses a technique in which a chelating agent is contained in a developing solution (i.e., an aqueous solution of an alkali silicate), whereby the generation of insoluble calcium silicate or magnesium silicate is prevented that would otherwise occur if the alkali silicate in the developing solution reacted with calcium or magnesium ions in the diluting water.

However, these conventional techniques are still unsatisfactory in their effectiveness for preventing the formation of a precipitate caused by the binding of silicic acid with calcium ions in the diluting water particularly in the case where they are applied to a development system of the type that processes presensitized offset printing plates individually with a substantially virgin developing solution, which is disposed of after use. This probably due to the following two reasons. First, compared to the case of recycling the developing solution, more of the working solution which is a mixture of the concentrated developing solution and diluent water will pass through the feed pump or the temperature controlling heater. Second in the use of a recycled developing solution, the contents of calcium and magnesium in the developing solution will decrease in proportion to the amounts in which are used to form sludge but this does not occur in the method under consideration (i.e., a substantially virgin developing solution is supplied for processing individual printing plates and is disposed of after use), so that the developing solution passing through the feed pump or the temperature controlling heater will contain invariably large amounts of calcium and magnesium, which eventually leads to the formation of more sludge.

SUMMARY OF THE INVENTION

An object, therefore, of the present invention is to provide a method of developing presensitized offset printing plates that effectively prevents calcium ions in diluent water from binding with the silicic acid in a developing solution to form a precipitate.

Another object of the present invention is to provide an apparatus that is suitable for implementing this method of developing presensitized offset printing plates.

The first object of the present invention can be attained by a method that is implemented with an automatic processor for developing presensitized offset printing plates with a substantially virgin aqueous solution that contains an alkali silicate and that is supplied for each printing plate, which method is characterized in that said aqueous solution contains calcium ions in an amount of up to 10 mg/L.

The second object of the present invention can be attained by a developing apparatus that comprises a means of mixing a concentrated developing solution with diluent water to prepare a working solution and a means of applying the working solution onto the surface of a presensitized offset printing plate being transported, which apparatus is characterized by having a mechanism that performs ion-exchange on said diluent water before it is mixed with the concentrated developing solution.

DETAILED DESCRIPTION OF THE INVENTION

Figure 1:
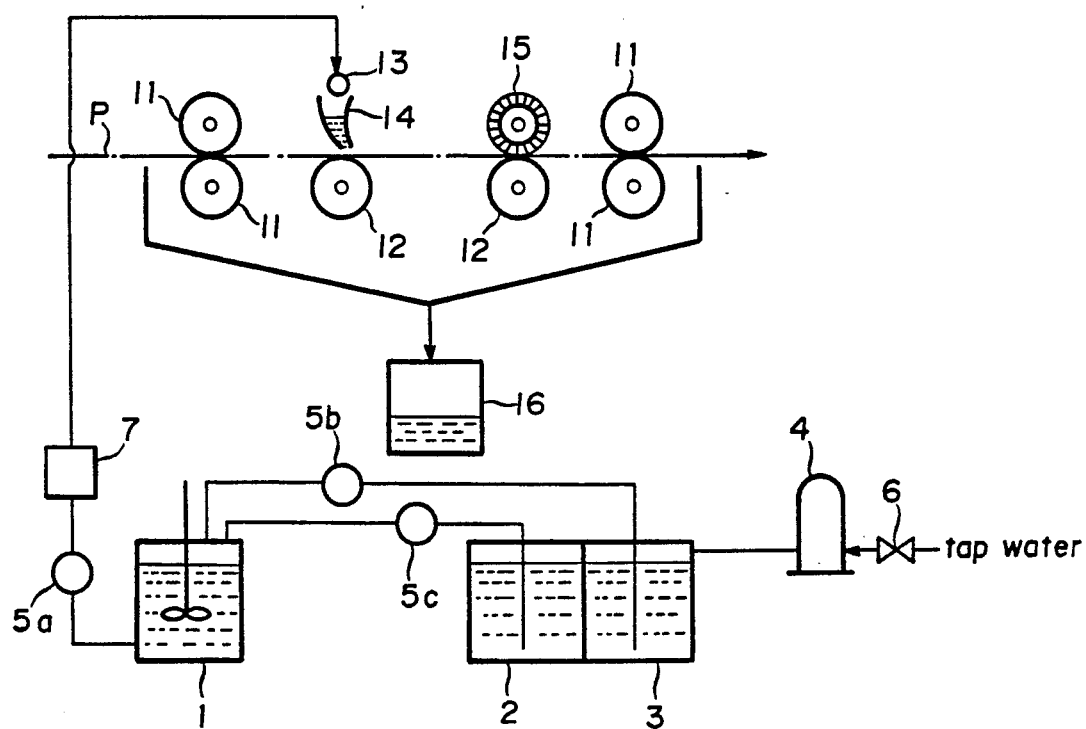
FIG. 1 is a schematic diagram showing a layout for the developing apparatus of the present invention.

It is essential for the purposes of the present invention that the concentration of calcium ions in the aqueous solution containing an alkali silicate be adjusted to no more than 10 mg/L. While there are no particular limitations on the means of achieving this, the present inventors have found that a preferred means is such that the concentration of calcium ions in the water used for diluting the concentrated developing solution can be reduced to 10 mg/L or below. Preferably, this can be achieved by performing ion-exchange on the diluent water. For ion-exchange, any known method can be used adopting a cation-exchange resin or an amphoteric ion-exchange resin. The concentration of calcium ions in the diluent water is more preferably 1 mg/L or below, and most preferably 0 mg/L.

Examples of the alkali silicate contained in the developing solution for use in the present invention include sodium silicate, potassium silicate and lithium silicate. The intended advantages of the present invention are attained within the range of 0.5–5 wt %.

The developing apparatus of the present invention is described below with reference to FIG. 1, which shows a layout for that apparatus. It comprises: a tank 1 for mixing a concentrated developing solution with diluent water to prepare a working solution; a tank 2 for the concentrated developing solution; a tank 3 for ion-exchanged water which is used in diluting the concentrated developing solution; an ion-exchanger 4; metering pumps 5a, 5b and 5c; a solenoid valve 6; and a heating and thermostatic unit 7 for heating and controlling the working developing solution at a constant temperature. The liquid levels in the mixing tank 1, the developer tank 2 and the diluent water tank 3 are controlled within fixed ranges by properly operating the pumps 5b 5c and solenoid valve 6 with the aid of level sensors and a control mechanism (not shown). The apparatus shown in FIG. 1 also includes the following components: a pair of transport rollers 11 for transporting a presensitized offset printing plate P; transport rollers 12 for transporting the printing plate; a nozzle 13 for supplying the developing solution; a means 14 of applying a virgin (fresh) developing solution onto the surface of the presensitized offset printing plate after it has been prepared in the mixing tank 1; a brush roller 15; and a tank 16 for the waste solution. As is clear from FIG. 1, the developing apparatus of the present invention is so designed that each of the presensitized offset printing plates being transported is processed with a fresh developing solution, which is thereafter discarded.

The means 14 of supplying the developing solution comprises two flexible plates (e.g. polyethylene terephthalate plates 75–175 μm thick) that are so arranged to form a slit at the lower end, the slit width being adjustable in proportion to the flow of the developing solution coming out of nozzle 13. For detailed information of the means 14, reference may be had to Unexamined Published Japanese Patent Application Nos. 238564/1987 and 200257/1989. Indicated by P in FIG. 1 is the transport path of the presensitized offset printing plate.

The ion-exchanger 4 may use either a cation-exchange resin or an amphoteric ion-exchange resin. Examples of useful ion-exchange resins are "Diaion" of Mitsubishi Kasei Corp. and "Amberlite MB-2".

In the present invention, a substantially virgin developing solution is supplied to the presensitized surface of each printing plate as it is processed. The term "virgin developing solution" means one that has not been used in the development of presensitized offset printing plates. The term "substantially virgin developing solution" does not necessarily mean a yet to be used developing solution but it covers those developing solutions which have a developing capability substantially equal to that of the virgin developing solution. An example of such "substantially virgin developing solutions" is one that has been once supplied to the presensitized offset printing plate but which simply flows down without being effectively used for development and which is recycled to be mixed with a virgin solution.

Examples of the presensitized offset printing plate that can be processed by the present invention include: a negative-acting presensitized offset printing plate that comprises a support overlaid with a light-sensitive layer containing a diazo compound as a light-sensitive component; a positive-acting presensitized offset printing plate that comprises a support overlaid with a light-sensitive layer containing an O-quinone diazide compound as a light-sensitive component; and an offset printing material that has a photoconductive layer on a support, that is processed by electrophotography to form a toner image, and that can subsequently be developed to strip the photoconductive layer in the non-image area. Besides the alkali silicate, the developing solution may contain an organic solvent, a surfactant, an inorganic reducing agent, a chelating agent, a defoaming agent, etc.

More specific examples include the following: a presensitized offset printing plate of the type described in Unexamined Published Japanese Patent Application No. 175757/1987, page 5, lower left column, line 18 - page 7, upper right column, line 11; presensitized offset printing plates combined with associated developing solutions, as described in Unexamined Published Japanese Patent Application Nos. 24263/1987, 24264/1987, 25761/1987, 35351/1987, 73271/1987, 75535/1987, 89060/1987, 125357/1987, 133460/1987, 159148/1987, 168160/1987, 175757/1987, 175758/1987, 200154/1988 and 205658/1988; and a presensitized offset printing plate processable by electrophotography of the type described in Unexamined Published Japanese Patent Application No. 25477/1983.

The following example is provided for the purpose of further illustrating the present invention but is in no way to be taken as limiting.

EXAMPLE

Presensitized offset printing plates were processed with a developing apparatus of the type shown in FIG. 1 using a developing solution of the recipe shown below which contained potassium silicate as an effective component. A running operation was performed for 2 months to check for the formation of a precipitate in the developing solution. The results are shown in Table 1. The concentration of calcium ions in the working solutions actually used was adjusted with an ion-exchanger as shown in Table 1.

Recipe of the Developing Solution

| | |
|---|---|
| Aqueous solution of Potassium silicate A (trade name of Nippon Kagaku K.K.; 27% $SiO_2$ and 13% $K_2O$) | 16 parts by weight |
| Aqueous solution of 50% KOH | 21 parts by weight |
| Water | 82 parts by weight |

The concentrated developing solution of this recipe was diluted 6 fold to prepare a working solution. Water containing calcium ions at a concentration of 200 mg/L was used as the diluent water and calcium ions in the diluent water were removed with a cartridge type water purifier Model G-10 of Organo Co., Ltd. being used as the ion-exchanger.

TABLE 1

| Concentration of $Ca^{2+}$ (mg/L) | Pump clogging | Heater clogging | Deposition of precipitate on printing plate |
|---|---|---|---|
| 1 | ○○ | ○○ | 0 |
| 10 | ○ | ○ | 0 |
| 20 | △ | △ | 2–3 per plate |
| 40 | X | X | 5–10 per plate |
| 100 | XXX | XXX | too many |

TABLE 1-continued

| Concentration of $Ca^{2+}$ (mg/L) | Pump clogging | Heater clogging | Deposition of precipitate on printing plate |
|---|---|---|---|
| | | | to count |

Key to the symbols in Table 1:
○○ ... No deposition on the pump or heater.
○ ... A thin layer of deposit in several areas.
Δ ... A thin layer of deposit covered the whole area.
X ... A fairly thick layer of deposit covered the whole area.
XXX ... Both the pump and the heater were nearly at the point of complete plugging.

As is clear from Table 1, the plugging of the pump and the heater and the deposition of a precipitate on printing plates could be completely prevented when the concentration of calcium ions in the developing solution containing an alkali silicate was 10 mg/L and less.

Using the method and apparatus of the present invention, a mixture of a concentrated developing solution containing an alkali silicate with diluent water can be used as a working solution for the development of presensitized offset printing plates without plugging the pump for feeding the working solution or the temperature controlling heater provided in the piping for the working solution and without causing a precipitate to be deposited on the printing plates. This effectively enhances the process stability of the development of presensitized offset printing plates.

The apparatus of the present invention has a built-in ion-exchanger and can be directly supplied with ordinary tap water and well water, so the efficiency of developing operations is significantly improved. Further, the ion-exchange of diluent water is performed just before it is mixed with the concentrated developing solution, so that the effects of carbon dioxide gas, oxygen and other deleterious materials can be sufficiently reduced to inhibit the formation of a precipitate more effectively than in the prior art.

These advantages of the present invention over the prior art which incorporates a water softener in the developing solution are particularly outstanding when water of high hardness is used as a diluent for concentrated developing solutions.

What is claimed is:

1. An apparatus for individually developing printing plates with a substantially virgin working solution comprising:
    means for ion-exchanging on a water to produce diluent water having calcium ions in amount of not more than 10 mg/l;
    means for mixing a concentrated developing solution with said diluent water to prepare a substantially virgin working solution;
    means for heating said substantially virgin working solution; and
    means for applying said heated substantially virgin working solution onto a surface of said printing plates being transported.

2. The apparatus of claim 1, wherein said diluent water has calcium ions in amounts of not more than 1 mg/l.

3. The apparatus of claim 1, wherein said concentrated developing solution contains an alkali silicate.

4. The apparatus of claim 3, wherein said alkali silicate is in amount of 0.5 to 5 weight % based on the weight of said working solution.

5. The apparatus of claim 1, wherein said applying means comprises two flexible plates for supplying said working solution.

6. The apparatus of claim 5, wherein said flexible plates are polyethylene terephthalate having a thickness of pb 75 to 175 μm.

* * * * *